(12) United States Patent
Handa et al.

(10) Patent No.: US 12,191,812 B2
(45) Date of Patent: Jan. 7, 2025

(54) LOW OFF-LEAKAGE CURRENT SWITCH

(71) Applicant: Analog Devices, Inc., Wilmington, DE (US)

(72) Inventors: Yukihisa Handa, Arlington, MA (US); Kerry Brent Phillips, Haverhill, MA (US); Matthew Thomas Juszkiewicz, Londonderry, NH (US)

(73) Assignee: Analog Devices, Inc., Wilmington, MA (US)

(*) Notice: Subject to any disclaimer, the term of this patent is extended or adjusted under 35 U.S.C. 154(b) by 512 days.

(21) Appl. No.: 17/697,711

(22) Filed: Mar. 17, 2022

(65) Prior Publication Data
US 2022/0393645 A1 Dec. 8, 2022

Related U.S. Application Data

(60) Provisional application No. 63/196,635, filed on Jun. 3, 2021.

(51) Int. Cl.
H03F 1/02 (2006.01)
H03F 3/45 (2006.01)

(52) U.S. Cl.
CPC ....... H03F 1/0205 (2013.01); H03F 3/45475 (2013.01)

(58) Field of Classification Search
CPC .................... H03F 1/0205; H03F 3/45475
USPC ........................................................ 330/252
See application file for complete search history.

(56) References Cited

U.S. PATENT DOCUMENTS

| 4,544,854 | A | 10/1985 | Ulmer et al. |
| 5,486,791 | A | 1/1996 | Spitalny et al. |
| 5,606,277 | A | 2/1997 | Feliz |
| 7,414,653 | B2 | 8/2008 | Fowler et al. |
| 7,657,191 | B2 | 2/2010 | Killmeyer et al. |
| 7,868,701 | B2 | 1/2011 | Nakamura et al. |
| 8,253,474 | B2 | 8/2012 | Rottner et al. |
| 9,287,841 | B2 | 3/2016 | Chiang et al. |

(Continued)

FOREIGN PATENT DOCUMENTS

| CN | 106656132 A | 5/2017 |
| CN | 110912521 A | 3/2020 |

(Continued)

OTHER PUBLICATIONS

"FET Input Analog Front End with ADC Driver: ADA4350", Analog Devices Data Sheet, (2016), 37 pgs.

(Continued)

Primary Examiner — Hafizur Rahman
(74) Attorney, Agent, or Firm — Schwegman Lundberg & Woessner, P.A.

(57) ABSTRACT

Low-leakage switch circuit techniques to reduce leakage current of an off-state switch, while maintaining a low on-resistance. The low-leakage switch circuit may allow measurement of low current signals in a transimpedance amplifier with improved accuracy without, the need for calibration. The low-leakage switch circuit may include a bootstrapping path connecting two or more terminals or voltage nodes of an off-state switch in the switch circuit. The bootstrapping path is configured to bootstrap major leakage current contributors in the switch circuit, such as the substrate diode leakage, the subthreshold leakage, or combinations thereof.

20 Claims, 19 Drawing Sheets

(56) References Cited

U.S. PATENT DOCUMENTS

| | | |
|---|---|---|
| 9,590,579 B2 | 3/2017 | Carter et al. |
| 9,831,842 B2 | 11/2017 | Kiritani |
| 9,882,539 B1 | 1/2018 | Shringarpure et al. |
| 10,224,887 B2 | 3/2019 | Frasch et al. |
| 10,419,014 B2 | 9/2019 | Pachchigar |
| 10,446,547 B2 | 10/2019 | Schober et al. |
| 10,476,457 B2 | 11/2019 | Schober et al. |
| 2012/0188003 A1 | 7/2012 | Rottner et al. |
| 2016/0099694 A1* | 4/2016 | Carter .................. H05K 13/00 330/254 |

FOREIGN PATENT DOCUMENTS

| | | |
|---|---|---|
| DE | 102004009684 B4 | 12/2014 |
| DE | 102012100558 B4 | 4/2015 |

OTHER PUBLICATIONS

Chioye, Luis, "Build a Programmable Gain Transimpedance Amplifier Using the OPA3S328", Texas Instruments Application Report SBOA521, (Jun. 2021), 26 pgs.

Orozco, Luis, "Programmable-Gain Transimpedance Amplifiers Maximize Dynamic Range in Spectroscopy Systems", Analog Dialogue 47-05, (May 2013), 5 pgs.

Rad, Reza E, et al., "A Dual-Mode Adjustable High-Gain Ultra-Low Noise TransimpedanceR/Amplifier for Fine Dust Detection", IEEE International Symposium on Circuits and Systems (ISCAS), (2020), 3 pgs.

* cited by examiner

LOW OFF-LEAKAGE CURRENT SWITCH

CLAIM OF PRIORITY

This application claims the benefit of priority of U.S. Provisional Patent Application Ser. No. 63/196,635, titled "LOW OFF-LEAKAGE CURRENT CMOS SWITCH" to Yukihisa Handa et al., filed on Jun. 3, 2021, the entire contents of which being incorporated herein by reference.

FIELD OF THE DISCLOSURE

This document relates generally to integrated circuits, and in particular relates to an integrated circuit used to implement an amplifier.

BACKGROUND

A transimpedance amplifier (TIA) is a circuit that is configured to convert an input current to an output voltage, with the ratio between the output voltage and the input current defining a transimpedance amplifier gain. A switchable gain or programmable gain TIA is a TIA that has one or more switches that switchably adjust the gain of the TIA.

TIAs are sometimes used to amplify a small amplitude electrical current signal from a sensor to an output voltage signal with a relatively large amplitude for further processing in a sensor apparatus. Sometimes a sensor apparatus includes one or more TIAs implemented in a semiconductor substrate, such as a silicon wafer. Some TIAs are implemented as complementary metal-oxide semiconductor (CMOS) integrated circuits in a silicon wafer.

SUMMARY OF THE DISCLOSURE

This disclosure describes, among other things, low-leakage switch circuit techniques to reduce leakage current of an off-state switch, while maintaining a low on-resistance. The low-leakage switch circuit may allow measurement of low current signals in a trans-impedance amplifier with improved accuracy without, the need for calibration. The low-leakage switch circuit may include a bootstrapping path connecting two or more terminals or voltage nodes of an off-state switch in the switch circuit. The bootstrapping path is configured to bootstrap major leakage current contributors in the switch circuit, such as the substrate diode leakage, the subthreshold leakage, or combinations thereof.

In some aspects, this disclosure is directed to a low off-leakage switched gain trans-impedance amplifier (TIA) circuit having an input terminal to receive an input current, the switched gain TIA circuit comprising: a first switch including a first transistor circuit coupled in series with a second transistor circuit via a first midpoint node, wherein a back-gate node of the second transistor circuit is coupled to the first midpoint node, and wherein the first switch has an ON state and an OFF state; a second switch including a third transistor circuit coupled in series with a fourth transistor circuit via a second midpoint node, wherein a back-gate node of the fourth transistor circuit is coupled to the second midpoint node, wherein the second switch has an ON state and an OFF state, wherein the second switch is configured to be in the ON state when the first switch is in the OFF state; an amplifier circuit including an output node coupled to an input node of the first switch and an input node of the second switch; and a bootstrapping circuit configured to receive a voltage and generate an output signal selectively coupleable to the first midpoint node and the second midpoint node to bias the first midpoint node or the second midpoint node to a representation of the voltage based on whether the first switch is in the OFF state or the second switch is in the OFF state, wherein an output of the first switch is coupled to a first resistor in a first feedback path of the TIA circuit, and wherein an output of the second switch is coupled to a second resistor in a second feedback path of the TIA circuit.

In some examples, this disclosure is directed to a method of operating a low off-leakage switched gain amplifier circuit having an input terminal to receive an input current, the method comprising: coupling a first switch including a first transistor circuit in series with a second transistor circuit via a first midpoint node, wherein a back-gate node of the second transistor circuit is coupled to the first midpoint node, and wherein the first switch has an ON state and an OFF state; coupling a second switch including a third transistor circuit in series with a fourth transistor circuit via a second midpoint node, wherein a back-gate node of the fourth transistor circuit is coupled to the second midpoint node, wherein the second switch has an ON state and an OFF state, and wherein the second switch is configured to be in the ON state when the first switch is in the OFF state; receiving, using a trans-impedance amplifier (TIA) circuit, the input current, wherein the TIA circuit has an output node coupled to an input node of the first switch and an input node of the second switch; receiving, using a bootstrapping circuit, a voltage and generating an output signal selectively coupleable to the first midpoint node and the second midpoint node to bias the first midpoint node or the second midpoint node to a representation of the voltage based on whether the first switch is in the OFF state or the second switch is in the OFF state; and coupling an output of the first switch to a first resistor in a first feedback path of the TIA circuit, and coupling an output of the second switch to a second resistor in a second feedback path of the TIA circuit.

In some examples, this disclosure is directed to a low off-leakage switched gain trans-impedance amplifier (TIA) circuit having an input terminal to receive an input current, the switched gain TIA circuit comprising: a first switch including a first transistor circuit coupled in series with a second transistor circuit via a first midpoint node, wherein a back-gate node of the second transistor circuit is coupled to the first midpoint node, and wherein the first switch has an ON state and an OFF state; an amplifier circuit including an output node coupled to an input node of the first switch and an input node of the second switch; and a bootstrapping circuit configured to receive a voltage and generate an output signal selectively coupleable to the first midpoint node to bias the first midpoint node to a representation of the voltage based on whether the first switch is in the OFF state, wherein an output of the first switch is coupled to a first resistor in a first feedback path of the TIA circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
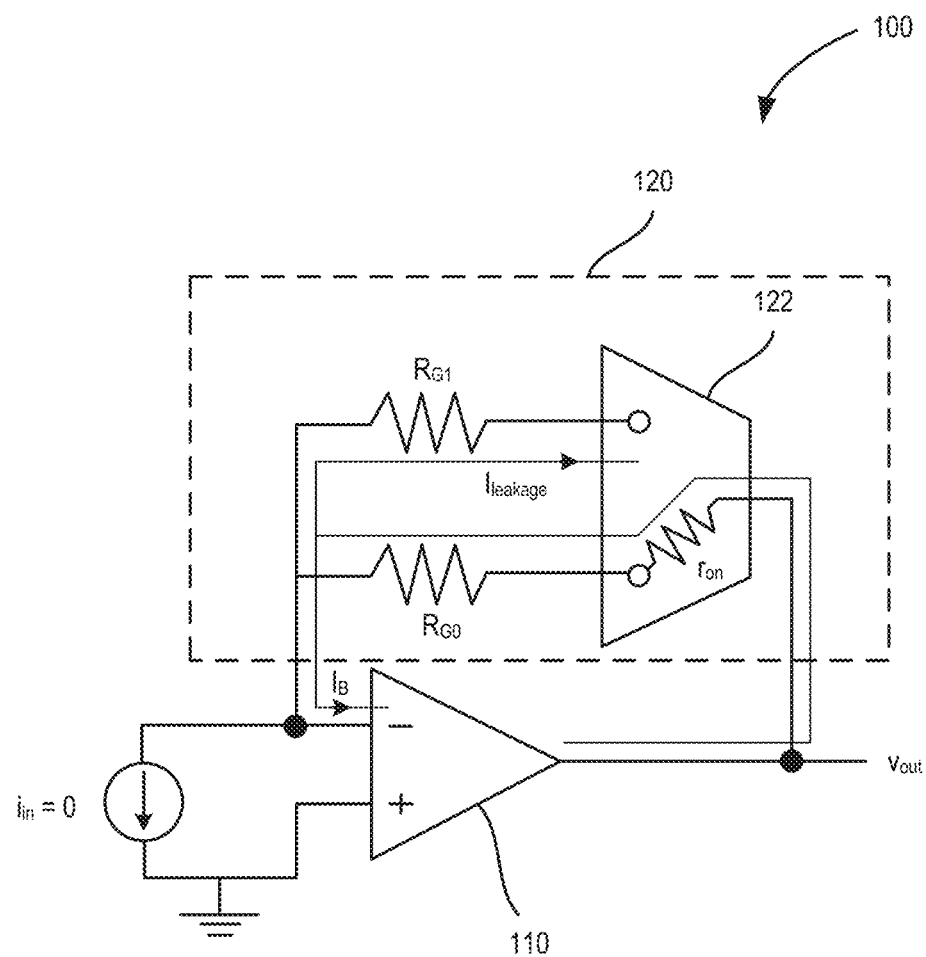
FIG. 1 is a simplified circuit diagram illustrating a TIA, in accordance with some embodiments.
Figure 2A:
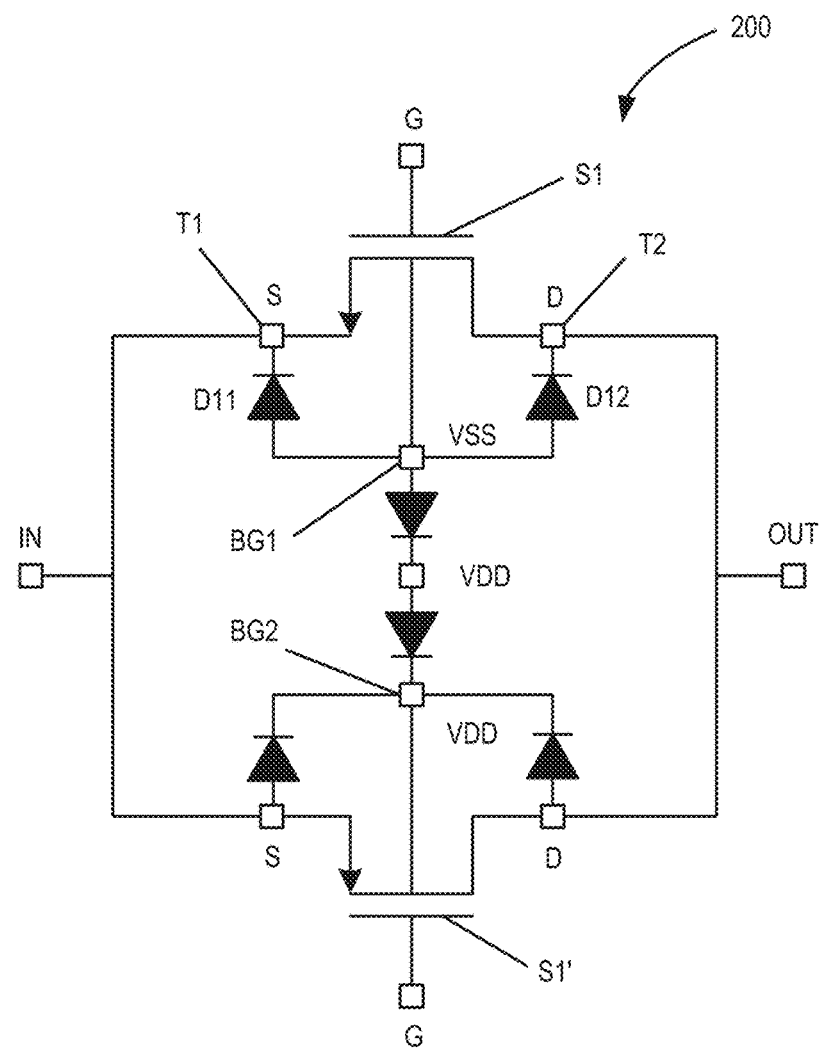
FIG. 2A is a schematic circuit diagram illustrating a switch circuit that may be used in the multiplexer of FIG. 1, in accordance with some embodiments.
Figure 2B:
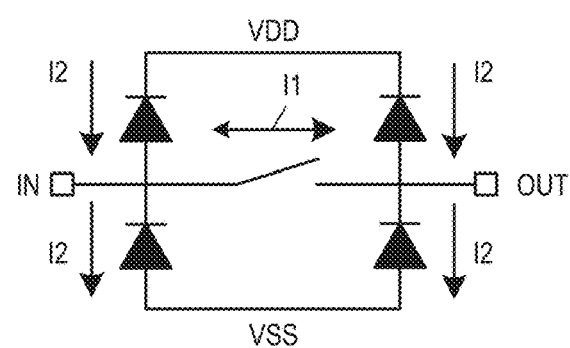
FIG. 2B is a simplified circuit diagram of transistors S1 and S1' shown in FIG. 2A.
Figure 2C:
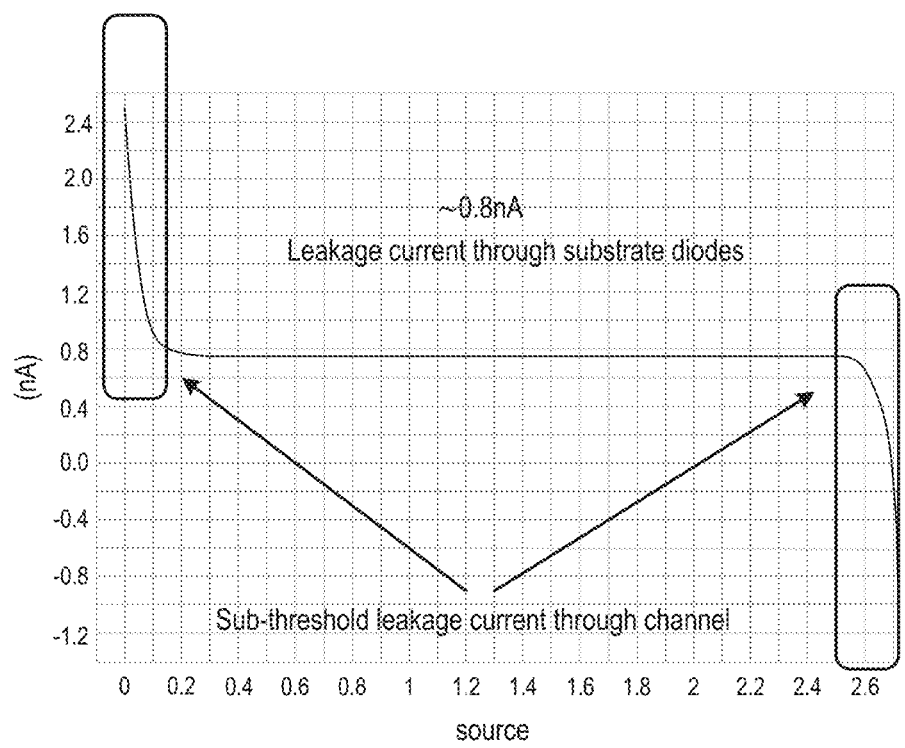
FIG. 2C is a graph illustrating a result of a simulation of the switch in FIG. 2A, in the absence of a bootstrap as discussed elsewhere in this application.
Figure 3:
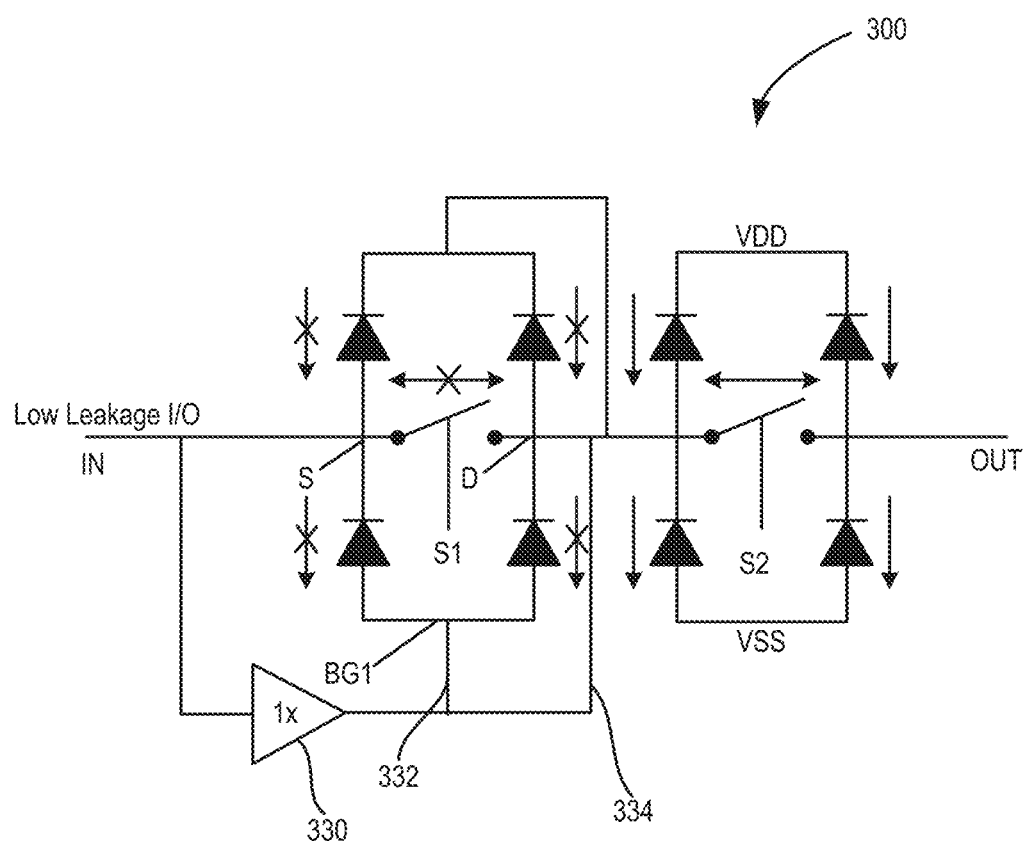
FIG. 3 is a simplified schematic diagram of a low-leakage switch circuit in which leakage current is reduced by bootstrapping the off-switch and parasitic diodes, in accordance with some embodiments.
Figure 7:
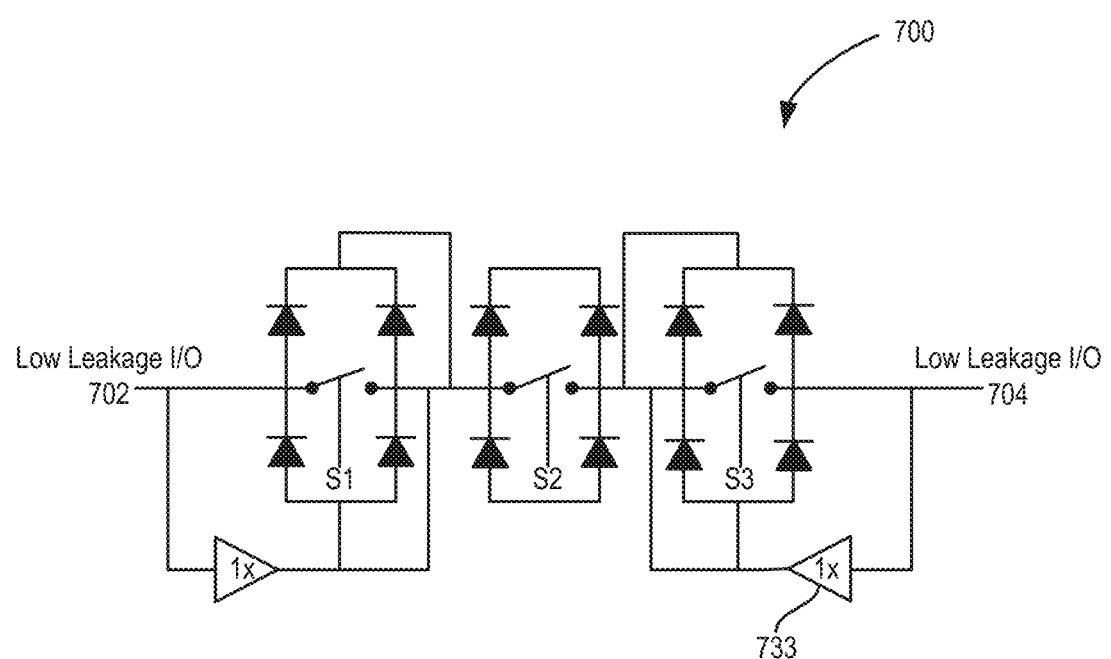
FIG. 7 is a simplified schematic diagram of a low-leakage switch circuit that is a variation of the switch circuit shown in FIG. 3, in accordance with some embodiments.

FIG. 7 is a simplified schematic diagram of a low-leakage switch circuit 700 that is a variation of the switch circuit 300 shown in FIG. 3, in accordance with some examples. Switch circuit 700 expands on switch circuit 700 to reduce leakage current from both I/O terminals 702 and 704 by adding a third switch S3 and a second bootstrapping amplifier circuit 733.

Figure 8:
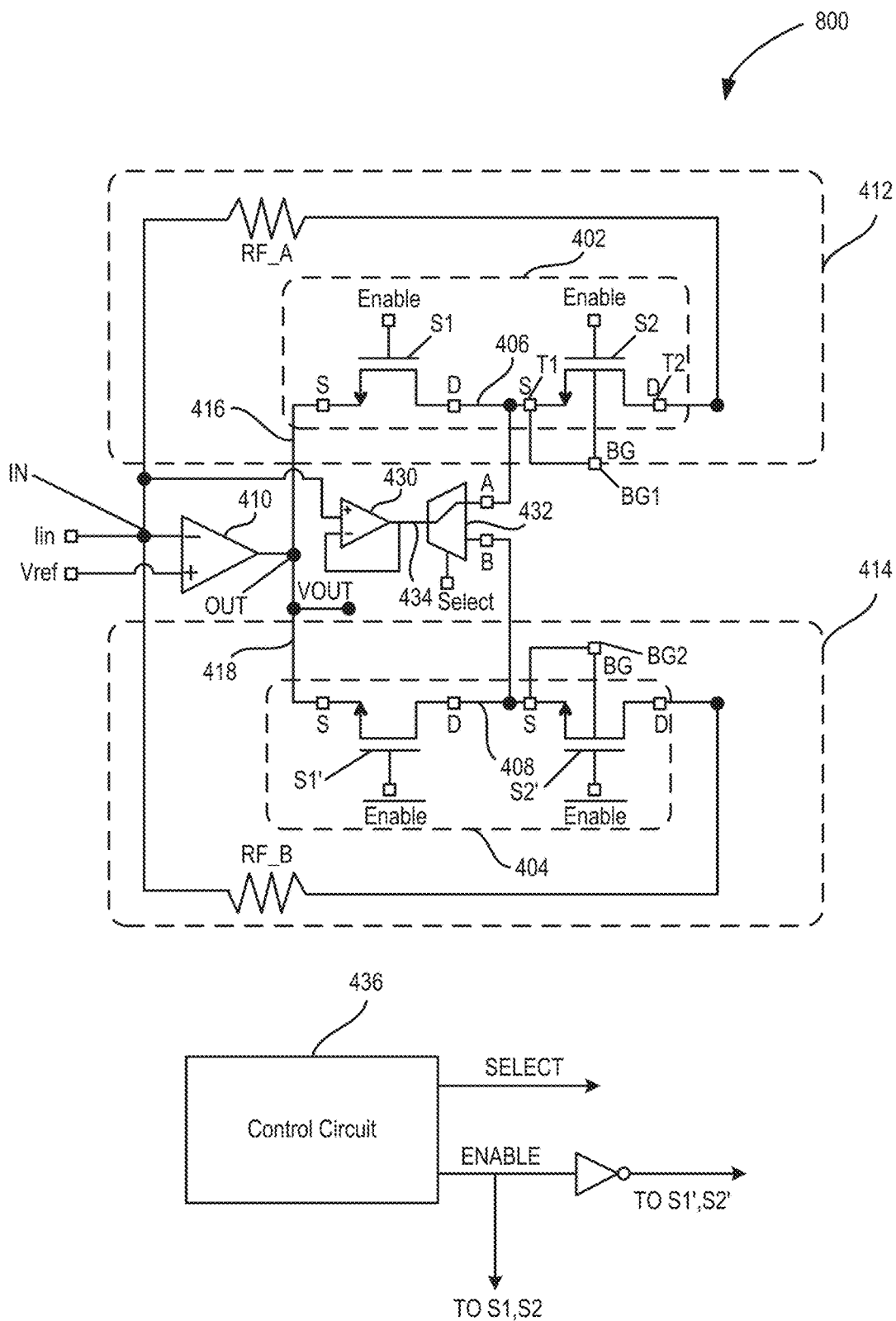
FIG. 8 is a schematic circuit diagram of another example of a low off-leakage switched gain trans-impedance amplifier circuit having an input terminal to receive an input current, in accordance with this disclosure.

FIG. 8 is a schematic circuit diagram of another example of a low off-leakage switched gain trans-impedance amplifier (TIA) circuit 800 having an input terminal to receive an input current, in accordance with this disclosure. The TIA 800 of FIG. 8 is similar to the TIA 400 of FIG. 4, with the transistors specifically shown as n-type field-effect transistors. In other examples, the transistors may be p-type field-effect transistors, or a combination of n-type and p-type field-effect transistors.

Figure 9:
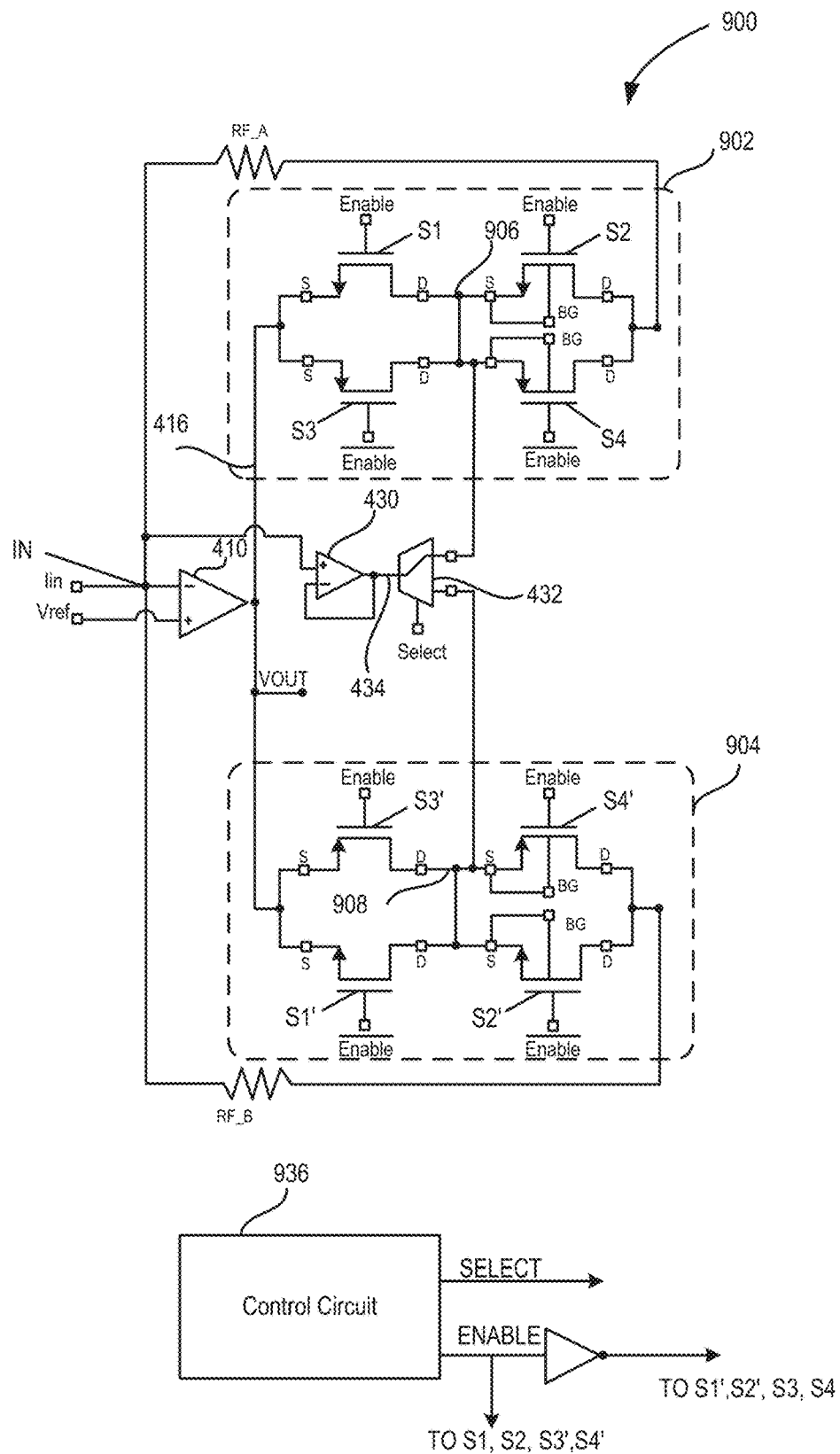
FIG. 9 is a schematic circuit diagram of another example of a low off-leakage switched gain trans-impedance amplifier circuit having an input terminal to receive an input current, in accordance with this disclosure.

FIG. 9 is a schematic circuit diagram of another example of a low off-leakage switched gain trans-impedance amplifier (TIA) circuit 900 having an input terminal to receive an input current, in accordance with this disclosure. In contrast to the circuits shown FIGS. 4 and 8, the TIA 900 of FIG. 9 includes the transistor circuits include transmission gate circuits. For example, a first transistor circuit of FIG. 9 includes a transmission gate formed by the transistors S1, S3, where the transistor S1 is a p-type FET and the transistor S3 is an n-type FET. A second transistor circuit of FIG. 9 includes a transmission gate formed by the transistors S2, S4, where the transistor S2 is a p-type FET and the transistor S4 is an n-type FET. A third transistor circuit of FIG. 9 includes a transmission gate formed by the transistors S1', S3', where the transistor S1' is a p-type FET and the transistor S3' is an n-type FET. A fourth transistor circuit of FIG. 9 includes a transmission gate formed by the transistors S2', S4', where the transistor S2' is a p-type FET and the transistor S4' is an n-type FET.

A first switch 902 may be formed by the first and second transistor circuits (the two transmission gates by the transistors S1, S3 and the transistors S2, S4). A second switch 904 may be formed by the third and fourth transistor circuits (the two transmission gates by the transistors S1', S3' and the transistors S2', S4').

In the first switch 902, the first transistor circuit is coupled in series with the second transistor circuit via a first midpoint node, where a back-gate node of the second transistor circuit is coupled to the first midpoint node 906, and the first switch 902 has an ON state and an OFF state. In the first switch 902, the back-gate node of the transistor S2 is coupled to the source terminal of the transistor S2 and the first midpoint node 906, and the back-gate node of the transistor S4 is coupled to the source terminal of the transistor S4 and the first midpoint node 906. The drain terminal of the transistor S1 is tied to the drain terminal of the transistor S3 at the midpoint node 906.

In the second switch 904 the third transistor circuit is coupled in series with the fourth transistor circuit via a second midpoint node 908, where a back-gate node of the fourth transistor circuit is coupled to the second midpoint node 908, and the second switch has an ON state and an OFF state, where the second switch 904 is configured to be in the ON state when the first switch 902 is in the OFF state. In the second switch 904, the back-gate node of the transistor S4' is coupled to the source terminal of the transistor S4' and the second midpoint node 908, and the back-gate node of the transistor S2' is coupled to the source terminal of the transistor S2' and the second midpoint node 908. The drain terminal of the transistor S3' is tied to the drain terminal of the transistor S1' at the midpoint node 908.

Figure 4:
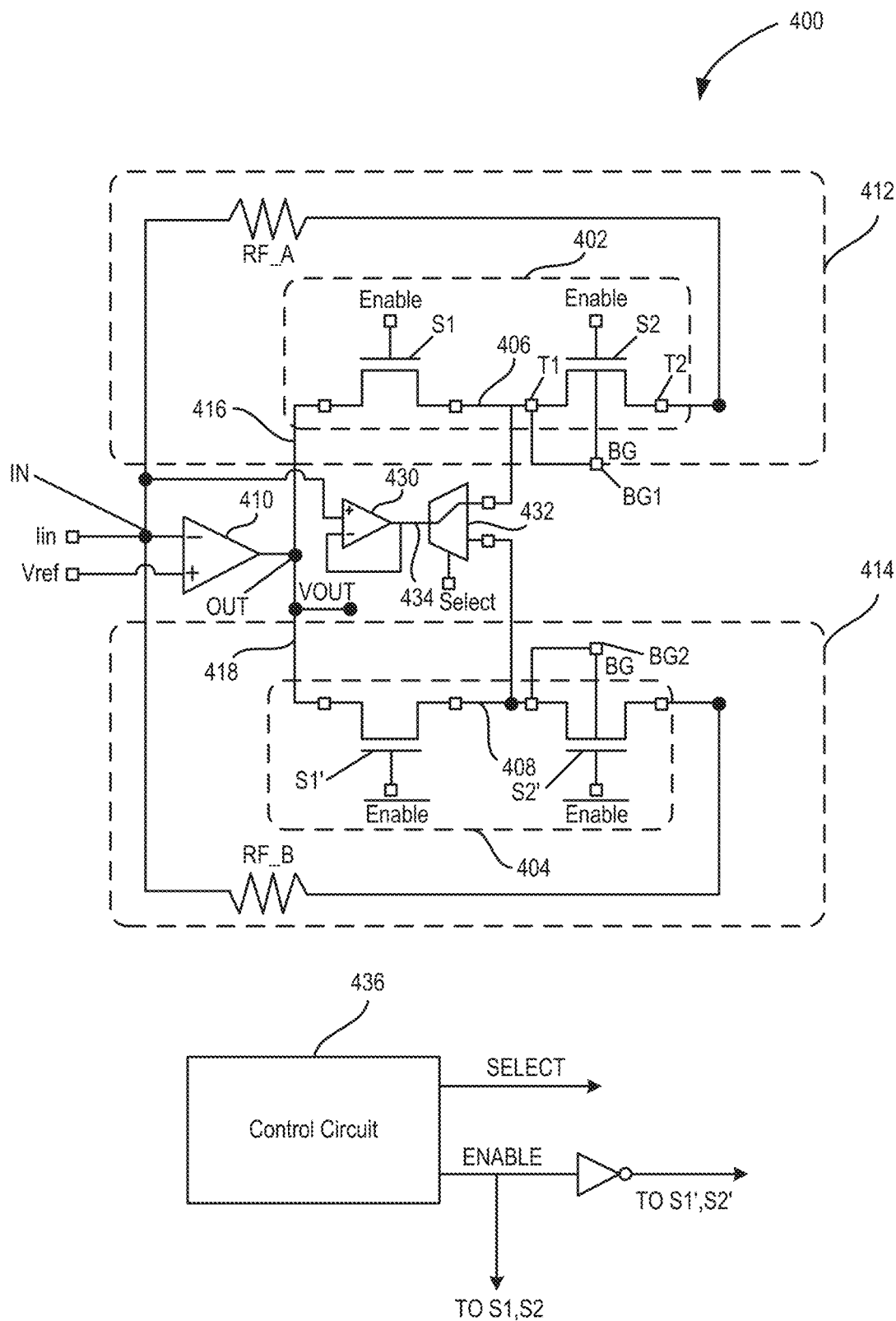
FIG. 4 is a schematic circuit diagram of an example of a low off-leakage switched gain trans-impedance amplifier (TIA) circuit having an input terminal to receive an input current, in accordance with this disclosure.
Figure 5A:
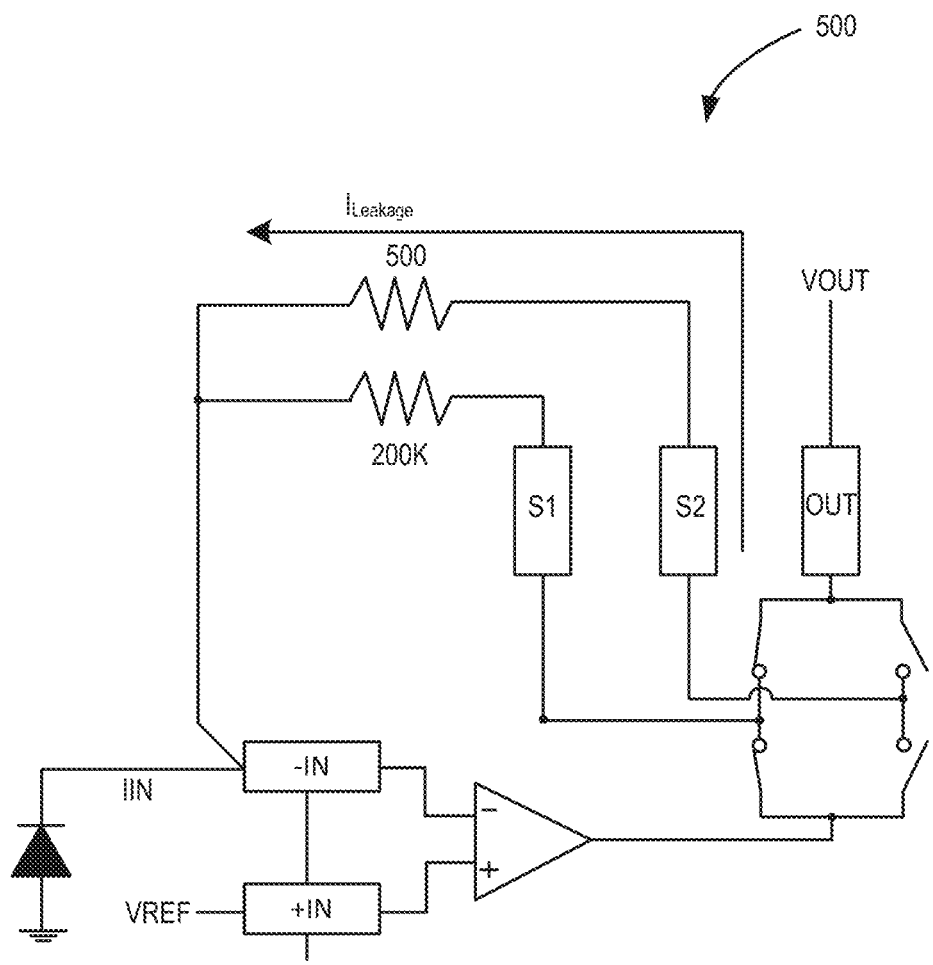
FIG. 5A is a schematic circuit diagram of a switchable-gain TIA having a low-leakage switch circuit, in accordance with some embodiments.
Figure 5B:
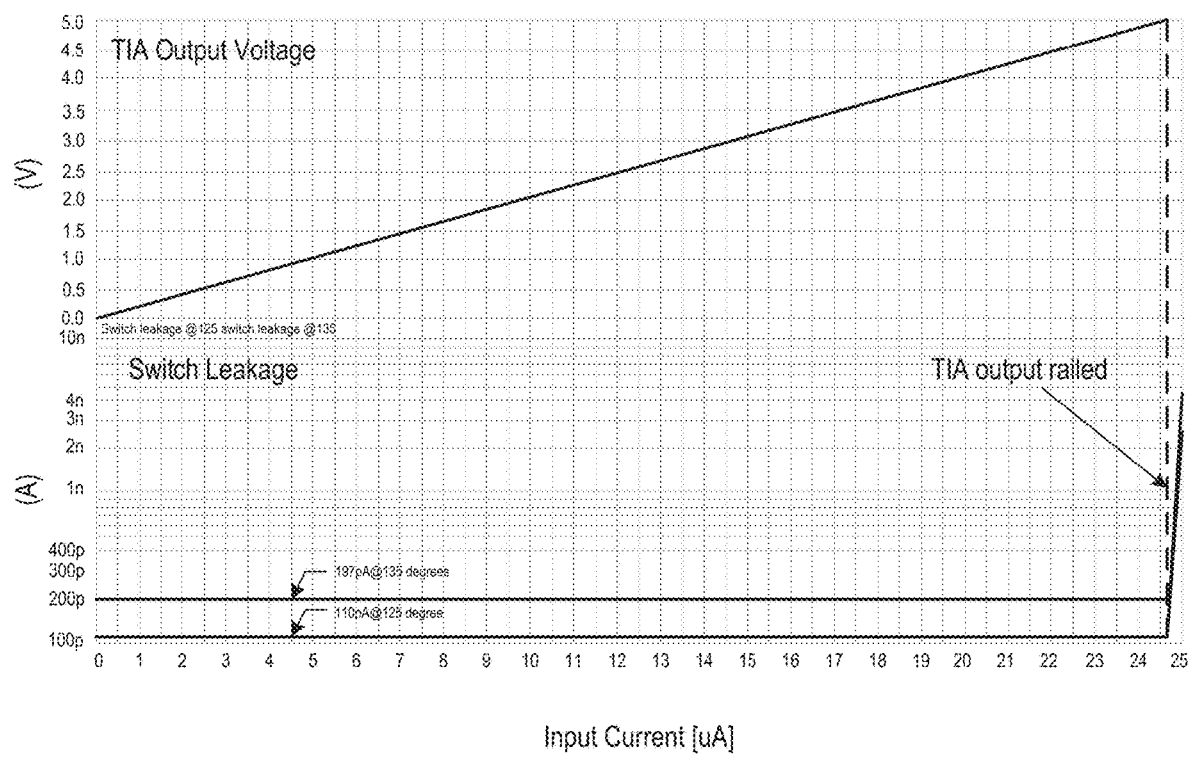
FIG. 5B is a graph of a simulation result of the TIA shown in FIG. 5A.
Figure 6:
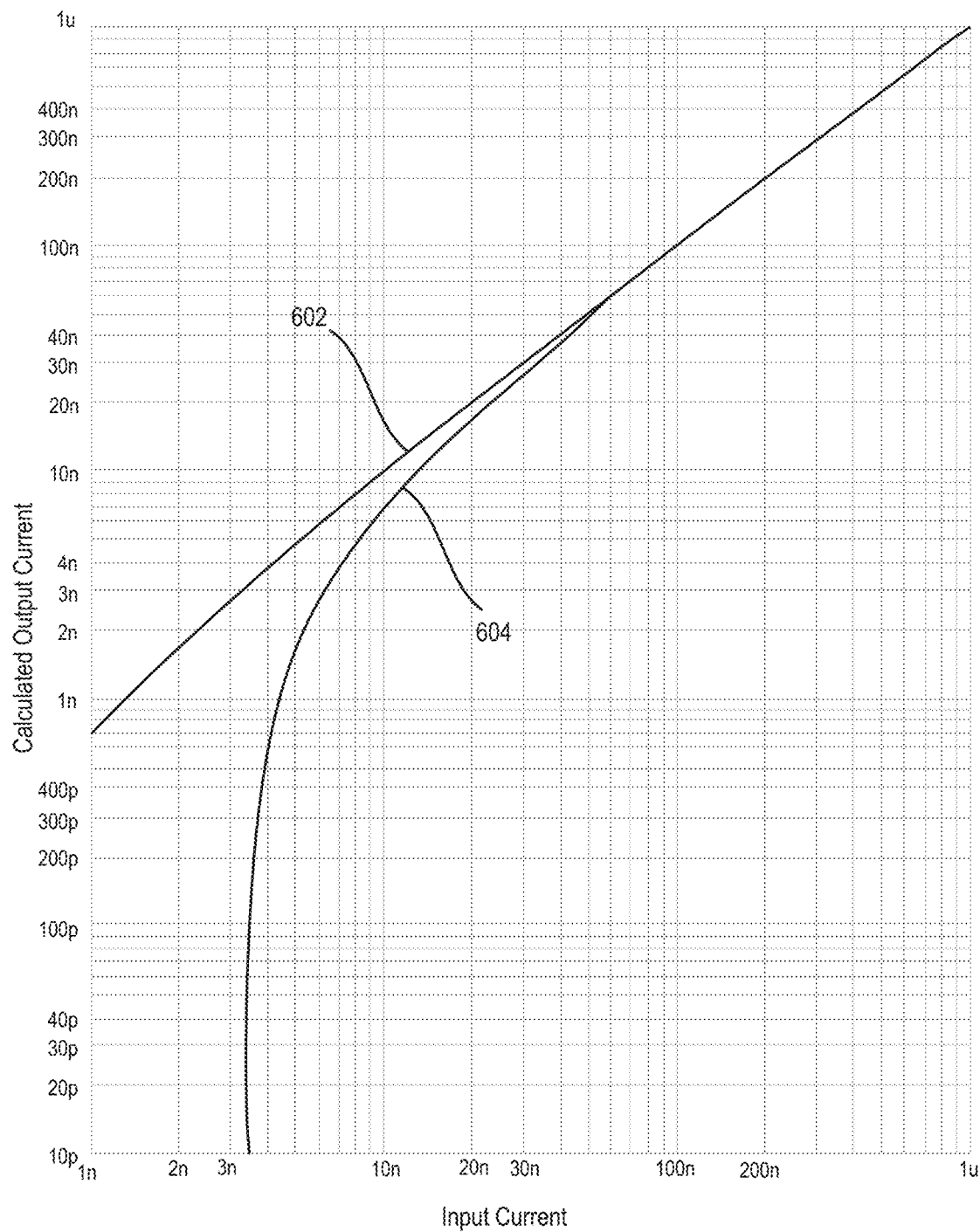
FIG. 6 is a graph showing a comparison between simulation results of a TIA using a low leakage current gain switch as described herein, and a TIA using a discrete gain switch.

Like in FIG. 4, the TIA 900 may include a bootstrapping circuit, such as including a bootstrapping amplifier circuit 430 configured to receive a copy of the voltage at node IN and generate an output signal at node 434 that is selectively coupleable to the first midpoint node 906 and the second midpoint node 908 to bias the first midpoint node 906 or the second midpoint node 908 to a representation of the voltage at node IN based on whether the first switch 902 is in the OFF state or the second switch 904 is in the OFF state. In some examples, the bootstrapping amplifier circuit 430 may be an amplifier circuit arranged in a unity gain configuration.

In FIG. 9, the bootstrapping amplifier circuit 430 may include a first bootstrapping input terminal, such as the non-inverting terminal of the amplifier circuit, coupled to the node IN and configured to receive the voltage at node IN.

The TIA 900 may further include a multiplexer circuit 432 coupled to an output of the bootstrapping amplifier circuit 430. The multiplexer circuit 432 may include a selectable output node (such as nodes A, B) to provide the output signal of the bootstrapping circuit. As an example, if a mux select signal ("select") is low, the node A may be selected (or ON) to connect the output of the bootstrapping amplifier circuit 430 to the first midpoint node 906, and node B is not selected (or OFF). If the mux select signal is high, the node B may be selected (or ON) to connect the output of the bootstrapping amplifier circuit 430 to the second midpoint node 908 and node A is not selected (or OFF).

As shown in FIG. 9 the second switch 904 in the bottom feedback path is turned on to enable gain resistance RF_B, while the first switch 902 in the opt feedback path is turned off. The multiplexer circuit 432 may selectively couple the bootstrapping amplifier circuit 430 between node IN and the source terminal of the off-state transistors S2, S4, such that both the source terminals and the back-gates BG are bootstrapped to the potential of the drain terminal to reduce off-state leakage current to the node IN via the source terminal. The operation of the TIA 900 is similar to the TIA 400 described above with respect to FIG. 4.

A control circuit 936 may output control signals to the multiplexer circuit 432 ("SELECT") and the transistors S1, S1', S2, S2', S3, S3', S4, and S4' ("ENABLE").

In examples where more than one feedback path is turned off, the multiplexer circuit 432 may be configured to selectively bootstrap switches in more than one feedback path to reduce off-state leakage current, as long as bootstrapping is not applied to the one feedback path currently turned on in the TIA.

Figure 10:
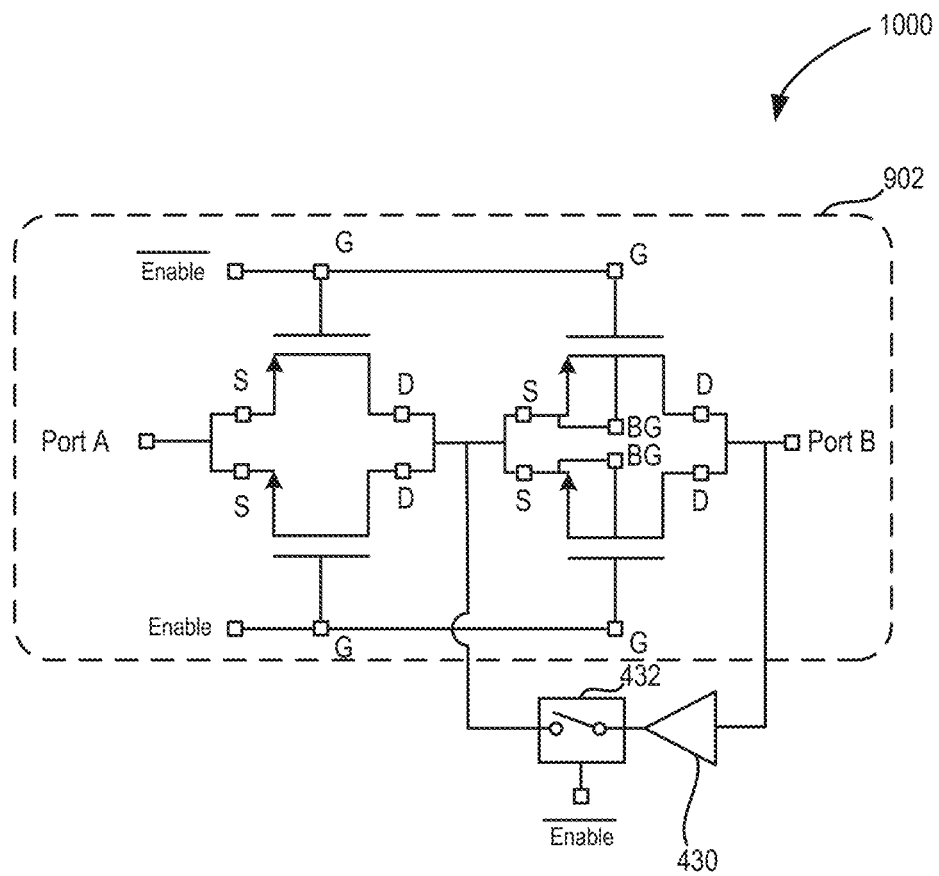
FIG. 10 is a schematic circuit diagram of an example of a portion of the low off-leakage switched gain trans-impedance amplifier circuit of FIG. 9.

FIG. 10 is a schematic circuit diagram of an example of a portion 1000 of the low off-leakage switched gain trans-impedance amplifier (TIA) circuit 900 of FIG. 9. By using the techniques of this disclosure, port B of a switch, such as the switch 902 of FIG. 9 (and the switch 904 of FIG. 9) may be a low-leakage port.

Figure 11:
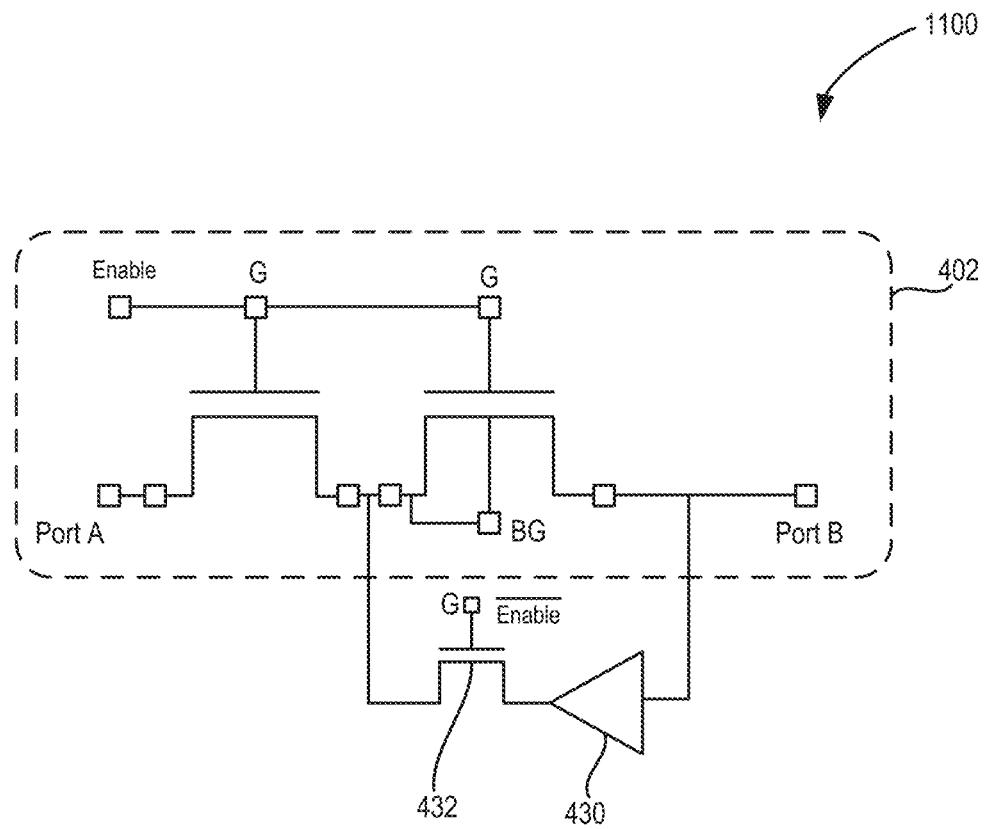
FIG. 11 is a schematic circuit diagram of an example of a portion of the low off-leakage switched gain trans-impedance amplifier circuit of FIG. 4.

FIG. 11 is a schematic circuit diagram of an example of a portion 1100 of the low off-leakage switched gain trans-impedance amplifier (TIA) circuit 400 of FIG. 4. By using the techniques of this disclosure, port B of a switch, such as the switch 402 of FIG. 4 (and the switch 404 of FIG. 4) may be a low-leakage port.

Figure 12:
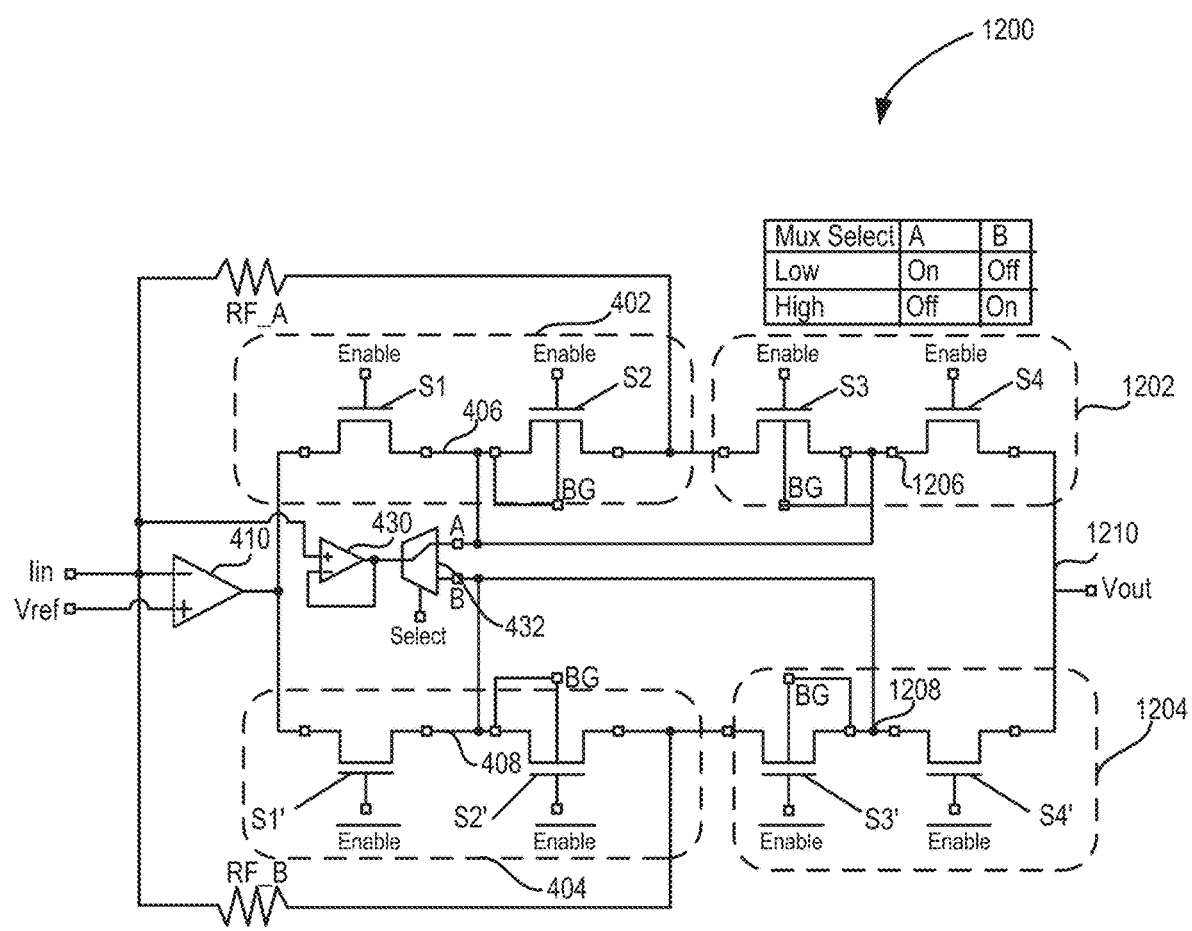
FIG. 12 is a schematic circuit diagram of an example of a low off-leakage switched gain trans-impedance amplifier circuit of FIG. 4 using a Kelvin switching configuration, in accordance with this disclosure.

FIG. 12 is a schematic circuit diagram of an example of a low off-leakage switched gain trans-impedance amplifier (TIA) circuit of FIG. 4 using a Kelvin switching configuration, in accordance with this disclosure. The first switch 402 and the second switch 404 may form a first switch circuit. In a Kelvin switching configuration, such as in FIG. 12, the TIA circuit 1200 may include a second switch circuit.

The second switch circuit may include a third switch 1202 that includes a first transistor circuit, such as including a transistor S3, coupled in series with a second transistor circuit, such as including a transistor S4, via a midpoint node 1206. A back-gate node BG of the second transistor circuit is coupled to the midpoint node 406 of the first switch circuit, and the first switch 402 has an ON state and an OFF state.

The second switch circuit may further include a fourth switch 1204 including a first transistor circuit, such as including a transistor S3', coupled in series with a second transistor circuit, such as including a transistor S4', via a midpoint node 1208. A back-gate node of the second transistor circuit is coupled to the second midpoint node 1208, and the second switch has an ON state and an OFF state, and the second switch is configured to be in the ON state when the first switch is in the OFF state. When the first switch 402 and the third switch 1202 are in the ON state, the second switch 404 and the fourth switch 1204 are in the OFF state. When the first switch 402 and the third switch 1202 are in the OFF state, the second switch 404 and the fourth switch 1204 are in the ON state.

The first switch circuit and the second switch circuit are coupled in series, and output 1210 of the second switch circuit is configured to provide an output signal VOUT of the switched gain amplifier circuit.

Figure 13:
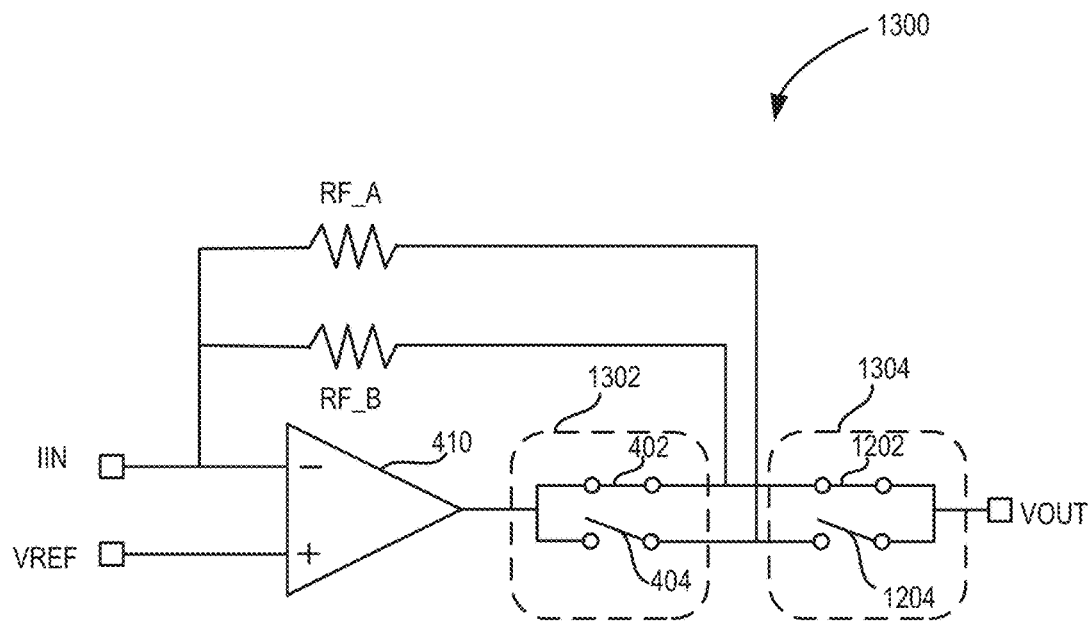
FIG. 13 is a simplified circuit diagram of the low off-leakage switched gain trans-impedance amplifier circuit of FIG. 12 using a Kelvin switching configuration, in accordance with this disclosure.

FIG. 13 is a simplified circuit diagram of the low off-leakage switched gain trans-impedance amplifier (TIA) circuit of FIG. 12 using a Kelvin switching configuration, in accordance with this disclosure. The TIA 1300 includes a first switch circuit 1302 coupled in series with a second switch circuit 1304. The first switch circuit 1302 may include the first switch 402 and the second switch 404, and the second switch circuit 1304 may include the third switch 1202 and the fourth switch 1204.

Figure 14:
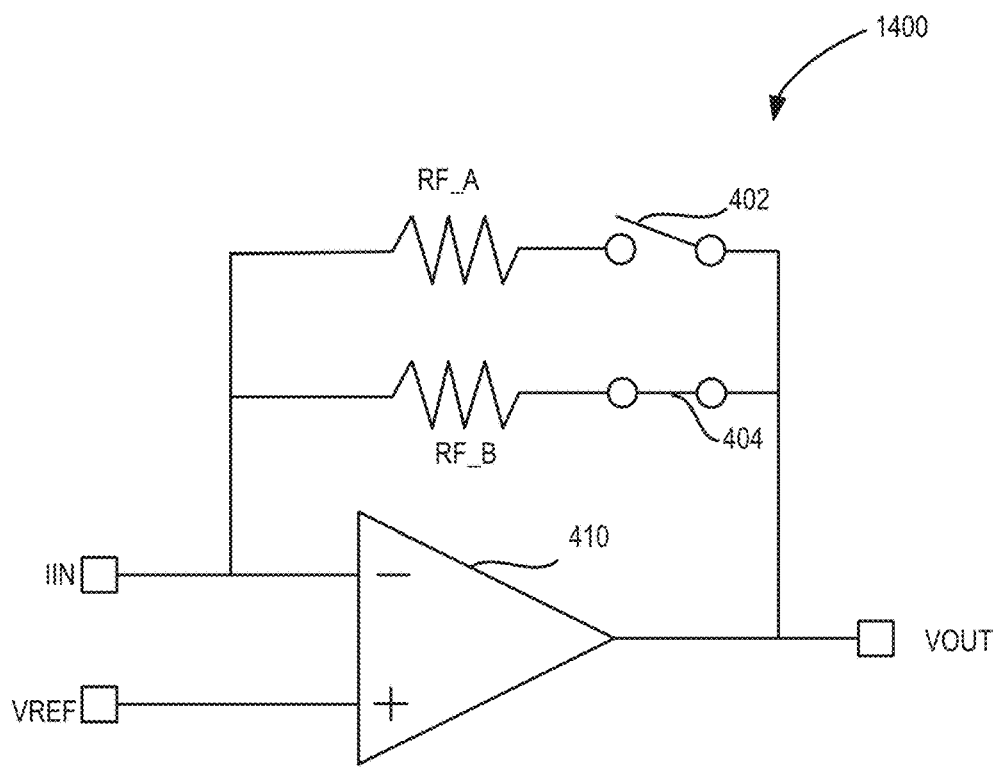
FIG. 14 is a simplified circuit diagram of the low off-leakage switched gain trans-impedance amplifier circuit of FIG. 4, in accordance with this disclosure.

FIG. 14 is a simplified circuit diagram of the low off-leakage switched gain trans-impedance amplifier (TIA) circuit of FIG. 4, in accordance with this disclosure. The TIA 1400 includes a first switch 402 in a first feedback path with a resistance RF_A and a second switch 404 in a second feedback path with a resistance RF_B.

Figure 15:
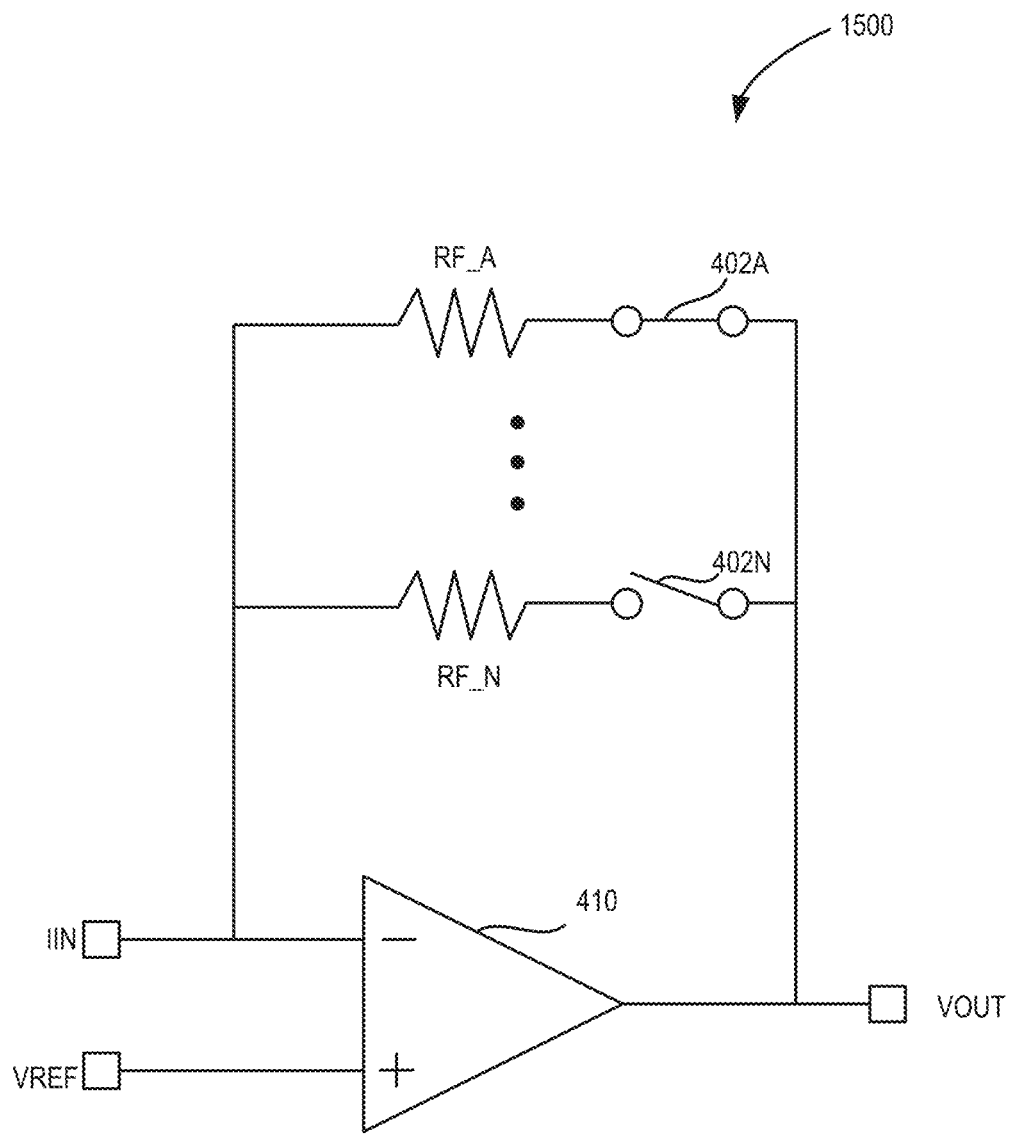
FIG. 15 is a simplified circuit diagram of a low off-leakage switched gain trans-impedance amplifier circuit, in accordance with this disclosure.

Although the TIA 400 of FIG. 4 and the TIA 1400 of FIG. 14 may include two switches, namely the first switch 402 and the second switch 404, other examples may include more than two switches, such as in FIG. 15.

FIG. 15 is a simplified circuit diagram of a low off-leakage switched gain trans-impedance amplifier (TIA) circuit, in accordance with this disclosure. The TIA 1500 includes N switches, such as a switches 402A-402N, where individual ones of the N switches 402A-402N are similar to the switch 402 in FIG. 4. The inclusion of N switches allows for N selectable resistances RF_A through RF-N.

Figure 16:
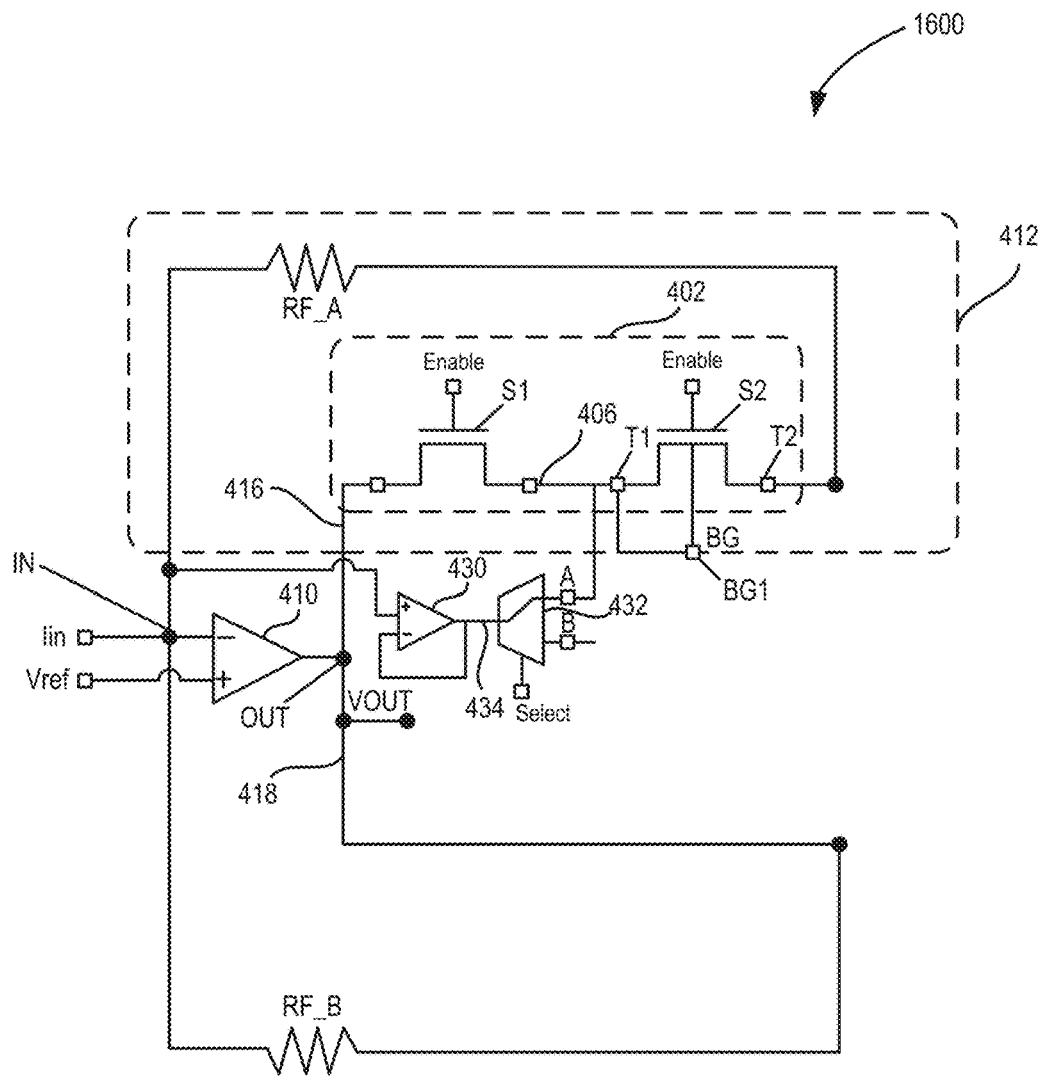
FIG. 16 is a schematic circuit diagram of an example of a low off-leakage switched gain trans-impedance amplifier circuit of FIG. 4 using a single switch configuration, in accordance with this disclosure.
Figure 16:
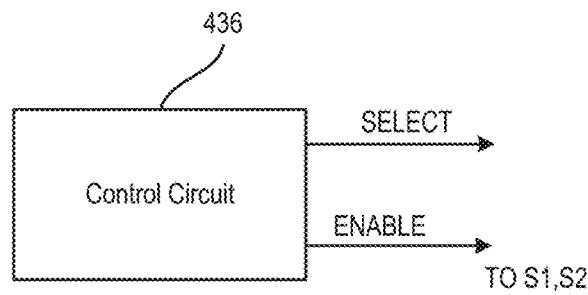

In some examples, the TIA 400 of FIG. 4 and the TIA 1400 of FIG. 14 may include one switch, namely the first switch 402, such as shown in FIG. 16.

FIG. 16 is a schematic circuit diagram of an example of a low off-leakage switched gain trans-impedance amplifier (TIA) circuit of FIG. 4 using a single switch configuration, in accordance with this disclosure. In contrast to the TIA 400 of FIG. 4, the TIA 1600 includes a single switch 402 with the switch 404 being removed such that the input node 418 of the switch 404 of FIG. 4 is hardwired to the output VOUT. The operation of the switch 402 of the TIA 1600 is similar to that described above with respect to FIG. 4 and, for purposes of conciseness, will not be described in detail again.

Figure 17:
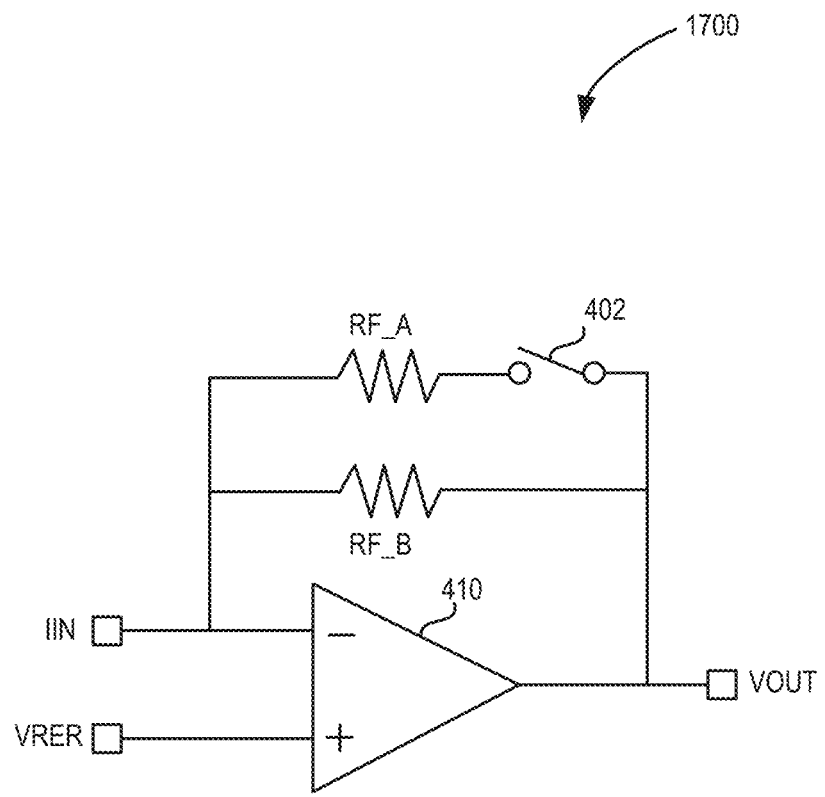
FIG. 17 is a simplified circuit diagram of the low off-leakage switched gain trans-impedance amplifier circuit of FIG. 16 using a single switch configuration, in accordance with this disclosure.

FIG. 17 is a simplified circuit diagram of the low off-leakage switched gain trans-impedance amplifier (TIN) circuit of FIG. 16 using a single switch configuration, in accordance with this disclosure. The TIA 1700 includes a switch 402 coupled between the resistance RF_A and the output node VOUT. In other example configurations, the switch 402 may be coupled between the input node and the resistance RF_A.

Figure 18:
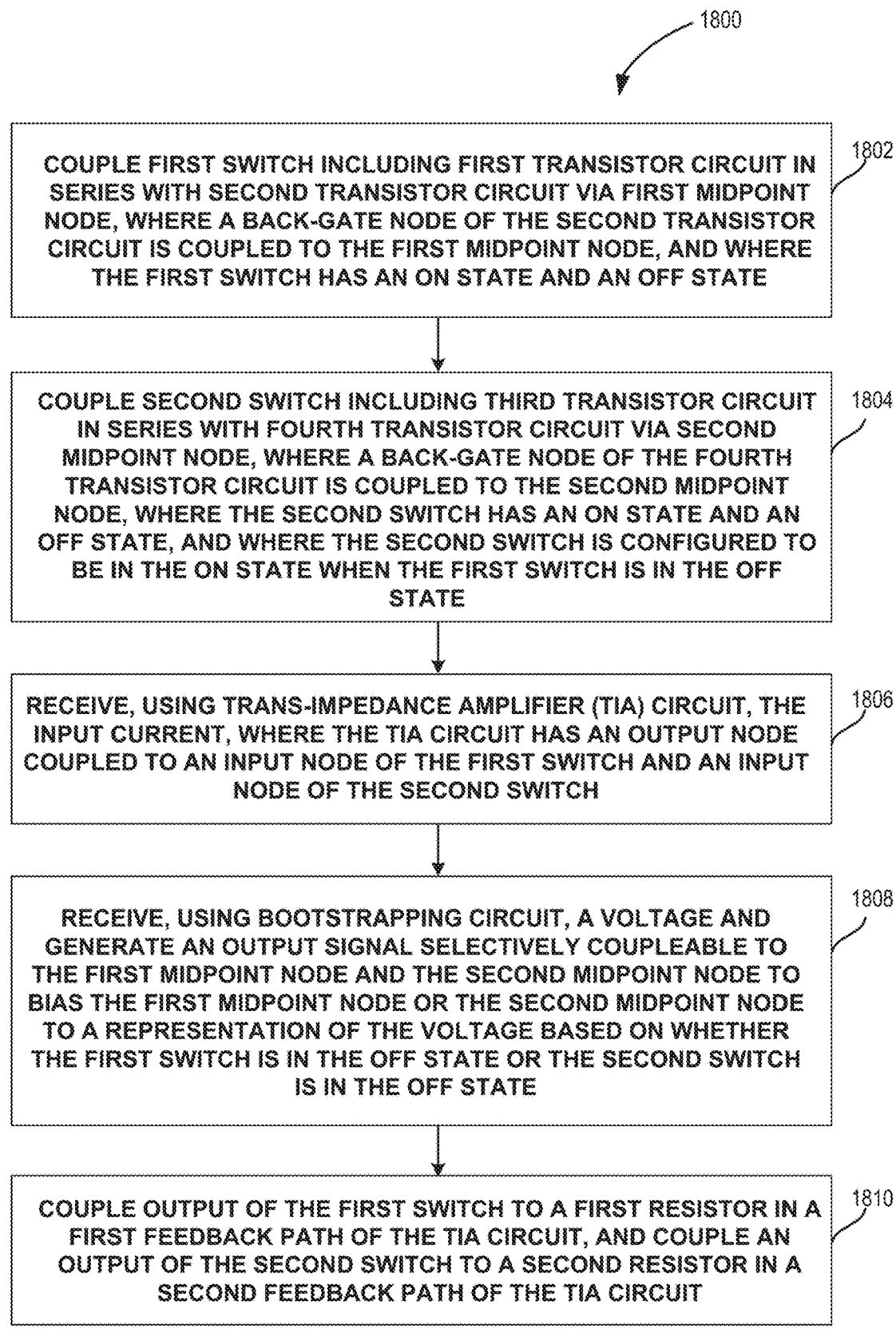
FIG. 18 is a flow diagram of an example of a method of operating a low off-leakage switched gain amplifier circuit having an input terminal to receive an input current.

FIG. 18 is a flow diagram of an example of a method 1800 of operating a low off-leakage switched gain amplifier circuit having an input terminal to receive an input current. At block 1802, the method 1800 may include coupling a first switch including a first transistor circuit in series with a second transistor circuit via a first midpoint node, wherein a back-gate node of the second transistor circuit is coupled to the first midpoint node, and wherein the first switch has an ON state and an OFF state.

At block 1804, the method 1800 may include coupling a second switch including a third transistor circuit in series with a fourth transistor circuit via a second midpoint node, wherein a back-gate node of the fourth transistor circuit is coupled to the second midpoint node, wherein the second switch has an ON state and an OFF state, and wherein the second switch is configured to be in the ON state when the first switch is in the OFF state;

At block 1806, the method 1800 may include receiving, using a trans-impedance amplifier (TIA) circuit, the input current, wherein the TIA circuit has an output node coupled to an input node of the first switch and an input node of the second switch;

At block 1808, the method 1800 may include receiving, using a bootstrapping circuit, a voltage and generating an output signal selectively coupleable to the first midpoint node and the second midpoint node to bias the first midpoint node or the second midpoint node to a representation of the voltage based on whether the first switch is in the OFF state or the second switch is in the OFF state.

At block 1810, the method 1800 may include coupling an output of the first switch to a first resistor in a first feedback path of the TIA circuit, and coupling an output of the second switch to a second resistor in a second feedback path of the TIA circuit.

In some examples, the method 1800 may include coupling a bootstrapping amplifier circuit to a multiplexer circuit. In some examples, the method 1800 may include coupling the bootstrapping amplifier circuit in a unity gain configuration. In some examples, the method 1800 may include selecting an output node of the multiplexer circuit to provide the output signal of the bootstrapping circuit.

In some examples, the method 1800 may include coupling the first midpoint node to a first terminal of the second transistor circuit, and coupling the back-gate node of the second transistor circuit to the first terminal of the second transistor circuit. In some examples, the first switch and the second switch form a first switch circuit, and the method 1800 may include coupling a second switch circuit to the first switch circuit to form a Kelvin switching configuration.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A low off-leakage switched gain trans-impedance amplifier (TIA) circuit having an input terminal to receive an input current, the switched gain TIA circuit comprising:
    a first switch including a first transistor circuit coupled in series with a second transistor circuit via a first midpoint node, wherein a back-gate node of the second transistor circuit is coupled to the first midpoint node, and wherein the first switch has an ON state and an OFF state;
    an amplifier circuit including an output node coupled to an input node of the first switch and an input node of a second switch; and
    a bootstrapping circuit configured to receive a voltage and generate an output signal selectively coupleable to the first midpoint node to bias the first midpoint node to a representation of the voltage based on whether the first switch is in the OFF state,
    wherein an output of the first switch is coupled to a first resistor in a first feedback path of the TIA circuit.

2. The switched gain amplifier TIA circuit of claim 1, wherein the bootstrapping circuit includes:
    a bootstrapping amplifier circuit including a first bootstrapping input terminal coupled to the input terminal and configured to receive the voltage; and
    a multiplexer circuit coupled to an output of the bootstrapping amplifier circuit, wherein the multiplexer circuit includes a selectable output node to provide the output signal of the bootstrapping circuit.

3. The switched gain amplifier TIA circuit of claim 2, wherein the bootstrapping amplifier circuit is arranged in a unity gain configuration.

4. The switched gain amplifier TIA circuit of claim 1, wherein the first midpoint node is coupled to a first terminal of the second transistor circuit, and wherein the back-gate node of the second transistor circuit is coupled to the first terminal of the second transistor circuit.

5. The switched gain amplifier TIA circuit of claim 1, wherein the first transistor circuit and the second transistor circuit include field-effect transistors.

6. The switched gain amplifier TIA circuit of claim 1, wherein the first transistor circuit and the second transistor circuit include transmission gate circuits, and wherein the transmission gate circuits include a p-type field-effect transistor and an n-type field-effect transistor.

7. The switched gain amplifier TIA circuit of claim 1, comprising:
    the second switch including a third transistor circuit coupled in series with a fourth transistor circuit via a second midpoint node, wherein a back-gate node of the fourth transistor circuit is coupled to the second midpoint node, wherein the second switch has an ON state and an OFF state, wherein the second switch is configured to be in the ON state when the first switch is in the OFF state.

8. A method of operating a low off-leakage switched gain amplifier circuit having an input terminal to receive an input current, the method comprising:
    coupling a first switch including a first transistor circuit in series with a second transistor circuit via a first midpoint node, wherein a back-gate node of the second transistor circuit is coupled to the first midpoint node, and wherein the first switch has an ON state and an OFF state;
    coupling a second switch including a third transistor circuit in series with a fourth transistor circuit via a second midpoint node, wherein a back-gate node of the fourth transistor circuit is coupled to the second midpoint node, wherein the second switch has an ON state and an OFF state, and wherein the second switch is configured to be in the ON state when the first switch is in the OFF state;
    receiving, using a trans-impedance amplifier (TIA) circuit, the input current, wherein the TIA circuit has an output node coupled to an input node of the first switch and an input node of the second switch;
    receiving, using a bootstrapping circuit, a voltage and generating an output signal selectively coupleable to the first midpoint node and the second midpoint node to bias the first midpoint node or the second midpoint node to a representation of the voltage based on whether the first switch is in the OFF state or the second switch is in the OFF state; and
    coupling an output of the first switch to a first resistor in a first feedback path of the TIA circuit, and coupling an output of the second switch to a second resistor in a second feedback path of the TIA circuit.

9. The method of claim 8, comprising:
coupling a bootstrapping amplifier circuit to a multiplexer circuit.

10. The method of claim 9, comprising:
coupling the bootstrapping amplifier circuit in a unity gain configuration.

11. The method of claim 9, comprising:
selecting an output node of the multiplexer circuit to provide the output signal of the bootstrapping circuit.

12. The method of claim 8, comprising:
coupling the first midpoint node to a first terminal of the second transistor circuit, and coupling the back-gate node of the second transistor circuit to the first terminal of the second transistor circuit.

13. The method of claim 8, wherein the first switch and the second switch form a first switch circuit, the method of claim 8 comprising:
    coupling a second switch circuit to the first switch circuit to form a Kelvin switching configuration.

14. A low off-leakage switched gain trans-impedance amplifier (TIA) circuit having an input terminal to receive an input current, the switched gain TIA circuit comprising:
    a first switch including a first transistor circuit coupled in series with a second transistor circuit via a first midpoint node, wherein a back-gate node of the second transistor circuit is coupled to the first midpoint node, and wherein the first switch has an ON state and an OFF state;

a second switch including a third transistor circuit coupled in series with a fourth transistor circuit via a second midpoint node, wherein a back-gate node of the fourth transistor circuit is coupled to the second midpoint node, wherein the second switch has an ON state and an OFF state, wherein the second switch is configured to be in the ON state when the first switch is in the OFF state;

an amplifier circuit including an output node coupled to an input node of the first switch and an input node of the second switch; and a bootstrapping circuit configured to receive a voltage and generate an output signal selectively coupleable to the first midpoint node and the second midpoint node to bias the first midpoint node or the second midpoint node to a representation of the voltage based on whether the first switch is in the OFF state or the second switch is in the OFF state, wherein an output of the first switch is coupled to a first resistor in a first feedback path of the TIA circuit, and wherein an output of the second switch is coupled to a second resistor in a second feedback path of the TIA circuit.

15. The switched gain amplifier TIA circuit of claim 14, wherein the bootstrapping circuit includes:

a bootstrapping amplifier circuit including a first bootstrapping input terminal coupled to the input terminal and configured to receive the voltage; and a multiplexer circuit coupled to an output of the bootstrapping amplifier circuit, wherein the multiplexer circuit includes a selectable output node to provide the output signal of the bootstrapping circuit.

16. The switched gain amplifier TIA circuit of claim 15, wherein the bootstrapping amplifier circuit is arranged in a unity gain configuration.

17. The switched gain amplifier TIA circuit of claim 14, wherein the first midpoint node is coupled to a first terminal of the second transistor circuit, and wherein the back-gate node of the second transistor circuit is coupled to the first terminal of the second transistor circuit.

18. The switched gain amplifier TIA circuit of claim 14, wherein the first transistor circuit, the second transistor circuit, the third transistor circuit, and the fourth transistor circuit include field-effect transistors.

19. The switched gain amplifier TIA circuit of claim 14, wherein the first transistor circuit, the second transistor circuit, the third transistor circuit, and the fourth transistor circuit include transmission gate circuits, and wherein the transmission gate circuits include a p-type field-effect transistor and an n-type field-effect transistor.

20. The switched gain amplifier TIA circuit of claim 14, wherein the first switch and the second switch form a first switch circuit, wherein the switched gain amplifier circuit of claim 1 includes:

a second switch circuit including:

a first switch including a first transistor circuit coupled in series with a second transistor circuit via a first midpoint node, wherein a back-gate node of the second transistor circuit is coupled to the first midpoint node, and wherein the first switch has an ON state and an OFF state; and a second switch including a third transistor circuit coupled in series with a fourth transistor circuit via a second midpoint node, wherein a back-gate node of the fourth transistor circuit is coupled to the second midpoint node, wherein the second switch has an ON state and an OFF state, and wherein the second switch is configured to be in the ON state when the first switch is in the ON state, wherein the first switch circuit and the second switch circuit are coupled in series, and wherein an output of the second switch circuit is configured to provide an output signal of the switched gain amplifier circuit.

\* \* \* \* \*